United States Patent
Guha

(10) Patent No.: US 10,193,722 B2
(45) Date of Patent: Jan. 29, 2019

(54) HOLEVO CAPACITY ACHIEVING JOINT DETECTION RECEIVER

(71) Applicant: Raytheon BBN Technologies Corp., Cambridge, MA (US)

(72) Inventor: Saikat Guha, Cambridge, MA (US)

(73) Assignee: Raytheon BBN Technologies Corp., Cambridge, MA (US)

( * ) Notice: Subject to any disclaimer, the term of this patent is extended or adjusted under 35 U.S.C. 154(b) by 30 days.

(21) Appl. No.: 14/985,099

(22) Filed: Dec. 30, 2015

(65) Prior Publication Data
US 2016/0119170 A1 Apr. 28, 2016

Related U.S. Application Data

(60) Continuation of application No. 13/872,857, filed on Apr. 29, 2013, now Pat. No. 9,236,883, which is a
(Continued)

(51) Int. Cl.
*H03M 13/00* (2006.01)
*H04L 27/22* (2006.01)
(Continued)

(52) U.S. Cl.
CPC .......... *H04L 27/223* (2013.01); *H03M 13/05* (2013.01); *H04B 10/1121* (2013.01); *H04B 10/70* (2013.01)

(58) Field of Classification Search
CPC .. H03M 13/05; H04L 27/223; H04B 10/1121; H04B 10/70
See application file for complete search history.

(56) References Cited

U.S. PATENT DOCUMENTS

| 5,677,696 A | 10/1997 | Silverstein et al. |
| 5,768,297 A * | 6/1998 | Shor ............ B82Y 10/00 714/763 |

(Continued)

OTHER PUBLICATIONS

Giovannetti et al., "Classical Capacity of the Lossy Bosonic Channel: the Exact Solution", Physical Review Letter 92, 027902, Jan. 15, 2004, 4 pages.
(Continued)

*Primary Examiner* — Esaw T Abraham
(74) *Attorney, Agent, or Firm* — Harrity & Harrity, LLP

(57) ABSTRACT

An optical receiver may include a unitary transformation operator to receive an n-symbol optical codeword associated with a codebook, and to perform a unitary transformation on the received optical codeword to generate a transformed optical codeword, where the unitary transformation is based on the codebook. The optical receiver may further include n optical detectors, where a particular one of the n optical detectors is to detect a particular optical symbol of the transformed optical codeword, and to determine whether the particular optical symbol corresponds to a first optical symbol or a second optical symbol. The optical receiver may also include a decoder to construct a codeword based on the determinations, and to decode the constructed codeword into a message using the codebook. The optical receiver may attain superadditive capacity, and, with an optimal code, may attain the Holevo limit to reliable communication data rates.

20 Claims, 15 Drawing Sheets

Related U.S. Application Data division of application No. 13/307,439, filed on Nov. 30, 2011, now Pat. No. 8,620,166.

(60) Provisional application No. 61/430,791, filed on Jan. 7, 2011.

(51) Int. Cl.
  *H04B 10/112* (2013.01)
  *H04B 10/70* (2013.01)
  *H03M 13/05* (2006.01)

(56) References Cited

U.S. PATENT DOCUMENTS

| | | | | |
|---|---|---|---|---|
| 6,058,105 | A * | 5/2000 | Hochwald | H04B 7/0615 342/367 |
| 7,082,450 | B2 * | 7/2006 | Hallapuro | G06F 17/147 375/E7.226 |
| 7,583,747 | B1 | 9/2009 | Damen et al. | |
| 7,587,172 | B2 | 9/2009 | Kim et al. | |
| 7,660,533 | B1 * | 2/2010 | Meyers | H04B 10/70 380/255 |
| 7,720,168 | B2 | 5/2010 | Su et al. | |
| 7,860,720 | B2 * | 12/2010 | Thumpudi | G10L 19/008 704/200.1 |
| 8,064,327 | B2 * | 11/2011 | Kwon | H04L 27/2647 370/208 |
| 8,069,052 | B2 * | 11/2011 | Thumpudi | G10L 19/008 704/201 |
| 8,150,183 | B2 * | 4/2012 | Feria | H04N 19/63 348/409.1 |
| 8,306,436 | B2 | 11/2012 | Prat Goma et al. | |
| 8,378,852 | B2 * | 2/2013 | Naimer | G01C 23/00 340/500 |
| 8,503,885 | B2 * | 8/2013 | Meyers | B82Y 10/00 380/256 |
| 8,582,979 | B2 | 11/2013 | Bunge et al. | |
| 8,620,166 | B2 | 12/2013 | Guha | |
| 8,620,674 | B2 * | 12/2013 | Thumpudi | G10L 19/008 704/200 |
| 8,843,509 | B2 | 9/2014 | Csanyi et al. | |
| 8,873,968 | B2 | 10/2014 | Kikuchi | |
| 8,983,303 | B2 * | 3/2015 | Meyers | H04B 10/11 398/140 |
| 9,236,883 | B2 | 1/2016 | Guha | |

OTHER PUBLICATIONS

Hausladen et al., "Classical Information Capacity of a quantum channel", Physical Review A, vol. 54, No. 3, The American Physical Society, Sep. 1996, pp. 1869-1876.

Lloyd et al., "Sequential Projective Measurements for Channel Decoding", Physical Review Letters 106, The American Physical Society, Nov. 4, 2011, 4 pages.

Sasaki et al., "Realization of a Collective Decoding of Codeword States", Physical Review A 58, 159, Oct. 14, 1997, 10 pages.

Dolinar, Jr., "A Class of Optical Receivers using Optical Feedback", Ph.D. Thesis, Massachusetts Institute of Technology, May 10, 1976, 304 pages.

Buck et al., "Experimental Proposal for Achieving Superadditive Communication Capacities with a Binary Quantum Alphabet", Physical Review A 61, 032309, Mar. 5, 1999, 7 pages.

Helstrom, "Quantum Detection and Estimation Theory", 1976, 42 pages.

Shor, "The Adaptive Classical Capacity of a Quantum Channel, or Information Capacities of Three Symmetric Pure States in Three Dimensions", May 22, 2003, 44 pages.

Forney, Jr., "Concatenated Codes", Technical Report 440, Massachusetts Institute of Technology, Dec. 1, 1965, 114 pages.

Sefi et al., "How to Decompose Arbitrary Continuous-Variable Quantum Operations", Oct. 18, 2011, 11 pages.

Shannon, "The Bell System Technical Journal", A Mathematical Theory of Communication, vol. XXVII, No. 3, Jul. 1948, pp. 379-423.

Sasaki et al., "Quantum Channels Showing Superadditivity in Classical Capacity", Physical Review A, vol. 58, No. 1, The American Physical Society, Jul. 1998, XP-002370191, pp. 146-158.

Sasaki, "Optimum decision scheme with a unitary control process for binary quantum-state signals", The American Physical Society, Physical Review A, vol. 54, No. 4, Oct. 1996, pp. 2728-2736, XP002670192.

Takeoka et al., "Design of POVMs with Linear Optics and Continuous Measurement", Proceedings of SPIE, vol. 5631, 2005, pp. 68-79, XP040196451.

Lau et al., "Binary Quantum Receiver Concept Demonstration", Proceedings of SPIE, vol. 6105, 2006, pp. 1-7, XP040219061.

Sasaki et al., "A Demonstration of Superadditivity in the Classical Capacity of a Quantum Channel", Physics Letters A, vol. 236, No. 2, Dec. 1, 1997, 4 pages. XP002370193.

Guha et al., "PPM demodulation: On approaching fundamental limits of optical communications", IEEE International Symposium on Information Theory Jun. 13-18, 2010, pp. 2038-2042, XP031710425.

Guha et al., "On quantum limit of optical communications: concatenated codes and joint-detection receivers", 2011 IEEE International Symposium on Information Theory Proceedings, Jul. 31, 2011, pp. 274-278, XP031971736.

Guha, "Structured optical receivers to attain superadditive capacity and Holevo limit", Jan. 7, 2011, pp. 1-4, XP002374365.

Notification of the International Search Report and the Written Opinion of the International Searching Authority, or the declaration corresponding to PCT/US2011/064401, dated May 8, 2012, 23 pages.

* cited by examiner

US 10,193,722 B2

HOLEVO CAPACITY ACHIEVING JOINT DETECTION RECEIVER

REFERENCE TO RELATED APPLICATION

This application is a continuation of U.S. patent application Ser. No. 13/872,857, filed Apr. 29, 2013 (now U.S. Pat. No. 9,236,883), which is a divisional of U.S. patent application Ser. No. 13/307,439 filed Nov. 30, 2011 (now U.S. Pat. No. 8,620,166), which claims priority to U.S. Provisional Patent Application No. 61/430,791, filed Jan. 7, 2011, the disclosures of which are incorporated herein by reference.

BACKGROUND

The maximum amount of information that can be transmitted over a classical noisy communication channel is known as Shannon capacity. Shannon's theorem states that, for a noisy channel, if a transmission rate is less than the Shannon capacity, there exist error correction codes that allow a probability of error at a receiver to be made arbitrarily small. Thus, given the right error correction codes, the transmission rate may approach the Shannon capacity. When a modulation alphabet of a communication channel are quantum states, a Holevo limit is an upper bound to the Shannon capacity of the communication channel coupled with any receiver. Achieving the Holevo limit for a communication channel may be quite challenging.

SUMMARY

According to one aspect, an optical receiver may include a unitary transformation device to receive an n-symbol optical codeword associated with a codebook, and to perform an optical unitary transformation on the received optical codeword to generate a transformed optical codeword, where the unitary transformation is based on the codebook. The optical receiver may further include n optical detectors, where a particular one of the n optical detectors is to detect a particular optical symbol of the transformed optical codeword, and to determine whether the particular optical symbol corresponds to at least a first optical symbol or a second optical symbol. The optical receiver may also include a decoder to construct a codeword based on the determinations, and to decode the constructed codeword into a message using the codebook.

According to another aspect, a method, performed by an optical receiver, may include: receiving, by the optical receiver, an optical codeword associated with a codebook, the optical codeword including n symbols; performing, by the optical receiver, a unitary transformation on the received optical codeword to generate a transformed optical codeword including n transformed symbols, which may be an entangled state of n symbols, where the unitary transformation corresponds to a lossless rotation on the quantum states of the n symbols; n optical detectors detecting the n transformed symbols; determining, by the optical receiver and for the outputs of the n optical detectors detecting the n transformed symbols, whether a particular one of the n transformed symbols corresponds to at least a first optical symbol or a second optical symbol; and generating, by the optical receiver, an electrical estimate of the codeword, corresponding to the optical codeword, based on the determination.

According to yet another aspect, a method, performed by a computer device, may include: receiving, by the computer device, a codebook; generating, by the computer device, a minimum probability of error (MPE) basis for the codebook; generating, by the computer device, a measurement unitary matrix for the codebook by expressing codewords of the codebook in the MPE basis; generating, by the computer device, a single mode MPE basis based on representations of single mode measurements on binary symbols used to represent the codewords of the codebook; generating, by the computer device, a single mode measurement unitary matrix for the codebook by expressing the codewords of the codebook in the single mode MPE basis; and generating, by the computer device, a unitary transformation operator for the codebook by multiplying an inverse of the measurement unitary matrix with the single mode measurement unitary matrix.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION

Figure 1:
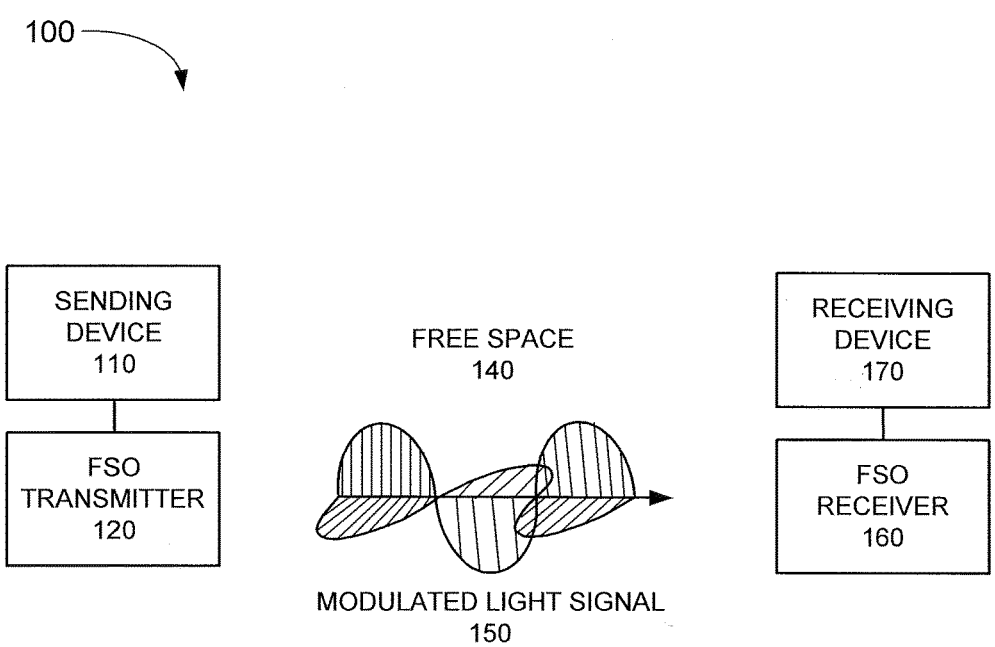
FIG. 1 is a diagram illustrating an example system according to an implementation described herein.

The following detailed description of the invention refers to the accompanying drawings. The same reference numbers may be used in different drawings to identify the same or similar elements.

An implementation described herein may relate to a joint-detection optical receiver (JDR) that can achieve superadditive channel capacity. Superadditivity may refer to a channel capacity higher than a channel capacity realizable by making single symbol measurements, and may be achieved by making joint measurements over multiple symbols. A joint measurement may correspond to a measurement of a quantum state of a codeword block that includes multiple symbols. Joint measurements made over multiple quantum state symbols for a communication channel may be necessary to achieve a Holevo limit associated with the communication channel.

An implementation described herein may relate to approaching a Holevo limit by performing a projective measurement. A projective measurement may be implemented by performing a unitary transformation on a quantum codeword, which may transform quantum states associated with symbols of the quantum codeword into superpositions of quantum states, followed by separable projective measurements. A unitary transformation on an optical codeword of n symbols may correspond to a lossless transformation on the quantum state of the n symbols. In other words, a unitary transformation on an optical codeword in a vector space may correspond to a transformation that preserves an inner product.

An optical receiver described herein, which may approach the Holevo limit, may include a unitary transformation operator and one or more separate optical detectors. In one example, the separate optical detectors may include Dolinar receivers. In another example, the separate optical detectors may include a different type of optical receiver, such as Kennedy receivers, Sasaki-Hirota receivers, homodyne receivers, heterodyne receivers, or single photon detectors.

A structure of the unitary transformation operator may be based on the codebook used to encode the codewords received by the receiver. In an example where the codebook corresponds to three two-symbol binary phase shifting key (BPSK) states, the unitary transformation operator may correspond to a beam splitter that acts on the two symbols. In an example where the codebook corresponds to a BPSK Hadamard code, the unitary transformation operator may correspond to a multi-stage butterfly 50-50 asymmetric beam splitter circuit. The multi-stage butterfly 50-50 asymmetric beam splitter circuit may be implemented as an integrated photonic circuit. The multi-stage butterfly 50-50 asymmetric beam splitter circuit may be known as a Green Machine. In general, the unitary transformation operator may be determined for a particular codebook and may be decomposed into a combination of elementary optical operators corresponding to a beam splitter operator, a shifter operator, a squeezer operator, and a third-order Hamiltonian operator, such as a Kerr non-linearity operator or a photon number resolving operator. In one example, the unitary transformation operator may be implemented as an integrated photonic circuit that includes a combination of a beam splitter, shifters, squeezers, and Kerr nonlinearity devices.

In some implementations, the unitary transformation operator may be implemented using more than two-symbol (binary) states. For example, an arbitrary unitary operator on a n-symbol codeword (where each symbol is chosen from a M-ary modulation constellation, such as BPSK or QPSK) may include: (a) beamsplitters, (b) phase shifters, (c) squeezers, and (d) Kerr non-linearities (or any other device that can provide a third-order Hamiltonian interaction). Photon number resolving (PNR) detectors, for instance, may be used to provide a third-order Hamiltonian interaction, and may potentially be used in place of Kerr non-linearities.

The unitary transformation operator may be generated, for a codebook, by generating a minimum probability of error (MPE) basis for the codebook, and by representing each codeword of the codebook in terms of the MPE basis to generate a first unitary matrix. A single measurement basis may be generated based on a Kronecker product of single mode MPE measurements on the individual symbols used to generate codewords of the codebook. Each codeword of the codebook may be represented in terms of the single measurement basis to generate a second unitary matrix, and the unitary transformation operator may be generated by multiplying an inverse of the first unitary matrix with the second unitary matrix.

FIG. 1 is a diagram illustrating an example system 100 according to an implementation described herein. As shown in FIG. 1, system 100 may be a sending (or transmitting) device 110, a free space optical (FSO) transmitter 120, a FSO receiver 160, and a receiving device 170.

Sending device 110 may generate a message and forward the message to FSO transmitter 120. FSO transmitter 120 may encode the message, may generate a modulated light signal 150 and may transmit light signal 150 across free space 140 to FSO receiver 160. Modulated light signal 150 may include, for example, a spatially encoded signal that includes a multiple number of orthogonal spatial modes, with a particular one of the orthogonal spatial modes carrying some of the information of the encoded message. In another example, modulated light signal 150 may include a temporally encoded signal. FSO receiver 160 may receive modulated light signal 150, may decode the message, and may forward the message to receiving device 170.

Sending device 110 and receiving device 170 may include any device with communication capability. For example, sending device 110 and receiving device 170 may include a personal computer or workstation, a server device, a portable computer, a voice over Internet Protocol (VoIP) telephone device, a radiotelephone, a satellite, a base station and/or another type of broadcast tower, a portable communication device (e.g. a mobile phone, a global positioning system (GPS) device, or another type of wireless device), a content recording device (e.g., a camera, a video camera, etc.), a sensor, and/or any other type of electronic device capable of communicating with another electronic device. Sending device 110 and receiving device 170 may include a same type of device or different types of devices.

FSO transmitter 120 may include one or more devices that receive an electrical message of k bits from sending device 110, encode the electrical message into an electrical codeword of n bits using a codebook (where n≥k), transform the n-bit electrical codeword into an n-symbol optical codeword, and transmit the optical n-symbol codeword across free space 140. FSO transmitter 120 may include, among other components, a wave plate, a beamsplitter, an electro-optic modulator, a laser transmitter, and/or an optical waveform generator.

FSO receiver 160 may include one or more devices that receive the n-symbol optical codeword from FSO transmitter 120, perform a unitary transformation on the received n-symbol optical codeword to generate a transformed n-symbol optical codeword, measure individual symbols of the transformed n-symbol optical codeword using n optical detectors to convert the individual symbols into n electrical symbols, decode the converted electrical symbols into an estimate of the k-bit message, and forward the decoded message to receiving device 170. FSO receiver 160 may include, among other components, a phase-locked loop, a fiber modulator, a digital oscilloscope, and/or an optical receiver telescope.

Although FIG. 1 shows example components of system 100, in other implementations, system 100 may include fewer components, different components, differently arranged components, and/or additional components than depicted in FIG. 1. Additionally or alternatively, one or more components of system 100 may perform one or more tasks described as being performed by one or more other components of system 100.

Figure 2A:
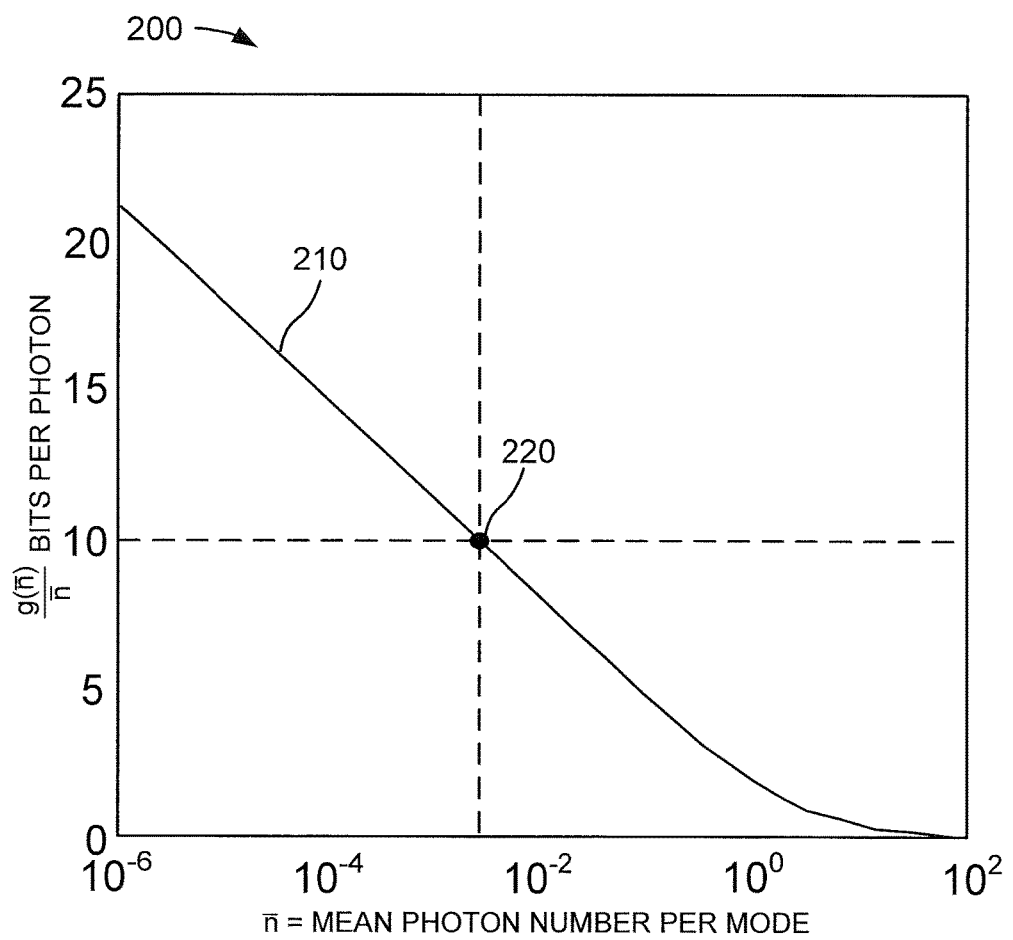
FIG. 2A is a diagram illustrating a graph of photon information efficiency as a function of the mean photon number per mode.

FIG. 2A is a diagram illustrating a graph 200 of photon information efficiency. As shown in FIG. 2A, graph 200 may illustrate a relationship between bits per photon and mean photon number per mode, represented as curve 210. Curve 210 may represent the information carrying capacity of photons, and may depict that no fundamental upper limit exists on the information that may be encoded in a photon. If one desires to encode more information in a photon, one may need to lower the mean photon number per mode. Point 220 may illustrate an example of the information carrying capacity of photons at 10 bits per photon. According to an implementation described herein, using FSO transmitter 120 at 1.55 micrometers (μm) and operating at a 1 gigahertz (GHz) modulation bandwidth, the laws of physics may permit reliable communication at 0.27 Gigabits per second (Gbps) using only 3.4 picowatts (pW) of average received optical power. At such low optical power levels, communications may be secure, as it may be difficult for an intercepting party to detect the signal.

Figure 2B:
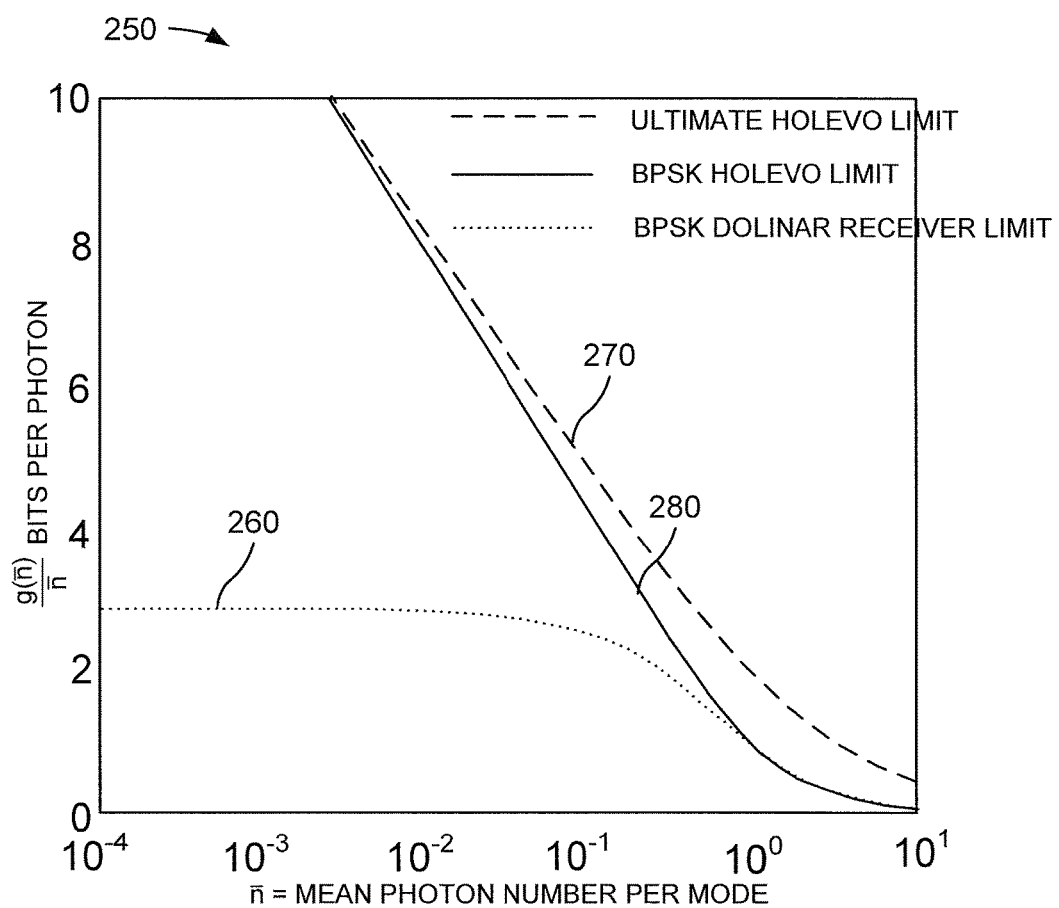
FIG. 2B is a diagram illustrating a graph of the relationship between a binary phase-shift keying modulation's Holevo limit and an ultimate Holevo limit.

FIG. 2B is a diagram illustrating a graph 250 of the relationship between a binary phase shift keying (BPSK) Holevo limit and an ultimate Holevo limit.

A BPSK modulation optical communication system may encode data by sending either an optical pulse or a 180° phase reversed optical pulse over each use of a physical channel. The maximum information that may be sent over the channel using any binary modulation scheme, such as BPSK, is 1 bit per channel use, which may be achieved if the two optical states are perfectly distinguishable at the receiver. The lower a mean photon number in each of the two BPSK states, the harder it is to tell the two optical states apart. The quantum limit to the minimum probability of error (MPE) of discriminating between the two optical pulses may be expressed as $$P_{min} = \frac{1}{2}\left[1 - \sqrt{1 - e^{-4N}}\right],$$

where N corresponds to the mean photon number in each of the two BPSK states. The quantum limit of the MPE may be lower than any probability of error achievable by an optical receiver (e.g., a direct optical detector, a homodyne optical detector, or a heterodyne optical detector). The quantum limit of the MPE may be achieved using a Dolinar receiver, which uses a single photon detector coupled with near instantaneous electrical to optical feedback from the electrical optical output of the single photon detector to optical input of the single photon detector.

Curve 260 may illustrate a highest Shannon capacity achievable by the BPSK modulation system using a single symbol receiver, which may be attained with a Dolinar receiver. Thus, a maximum capacity reachable by a single symbol receiver may correspond to 2/ln 2, or 2.89 bits per photon. Curve 270 may illustrate an ultimate Holevo limit of a joint detection receiver that performs a joint measurement over a codeword block of symbols using an optimal codebook. Curve 280 may illustrate the Holevo limit of a joint detection receiver that uses binary modulation. Thus, FIG. 2B may demonstrate that binary modulation (e.g., using BPSK) may be close to optimal to approaching the Holevo limit at low photon numbers per mode.

Figure 3:
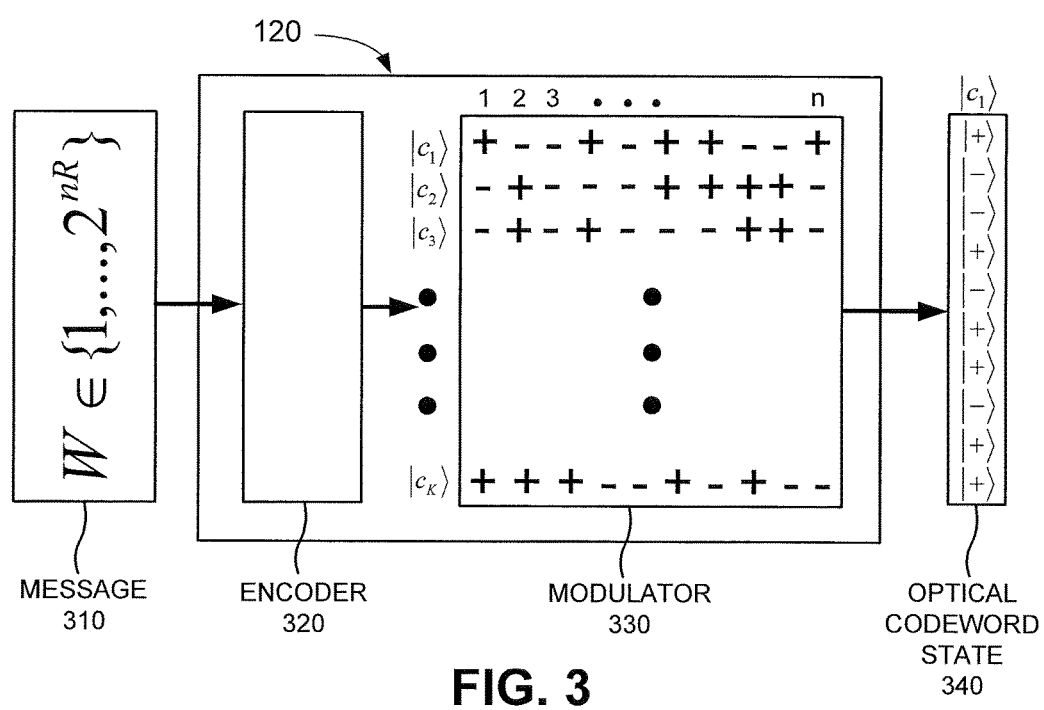
FIG. 3 is a diagram illustrating example components of a transmitter according to an implementation described herein.

FIG. 3 is a diagram illustrating example components of FSO 120 transmitter. As shown in FIG. 3, FSO transmitter 120 may include an encoder 320 and a modulator 330.

Sending device 110 may break up a message to be sent to receiving device 170 into k-bit messages. Encoder 320 may receive a k-bit message 310 and encode k-bit message 310 into an n-bit code word. The k-bit message may correspond to an element from the set $\{1, \ldots 2^{nR}\}$, where R corresponds to the transmission rate in bits per channel use, or bits per modulation symbol, n corresponds to the size of a codeword, and k=nR corresponds to the size of message 310. Thus, message 310 may correspond to any sequence of k bits. Encoder 320 may include a 1-1 map that maps a particular sequence of k bits to a particular codeword of n bits. Thus, each member of the set $\{1, \ldots 2^{nR}\}$ may be associated with a particular n-bit codeword. The set of n-bit codewords may correspond to the codebook.

Modulator 330 may receive a codeword from encoder 320 and may generate modulated light signal 150 that includes optical codeword state 340. Modulator 330 may use BPSK to convert bits of the received n-bit codeword into one of two possible light symbols |+a⟩ and |−a⟩. For example, |+a⟩ may correspond to a first phase of a photon and |−a⟩ may correspond to a second phase of a photon, where the second phase differs from the first phase by 180°. Modulator 330 may be implemented, for example, as a ferroelectric liquid crystal (FLC) array incorporated into an integrated circuit, in combination with a light source. An FLC may use birefringence to convert a voltage polarity into a rotation of the optical axis of light emitted by the light source. In another implementation, modulator 330 may be implemented using a different type of device.

Although FIG. 3 shows example components of FSO transmitter 120, in other implementations, FSO transmitter 120 may include fewer components, different components, differently arranged components, and/or additional components than depicted in FIG. 3. Additionally or alternatively, one or more components of FSO transmitter 120 may perform one or more tasks described as being performed by one or more other components of FSO transmitter 120.

Figure 4:
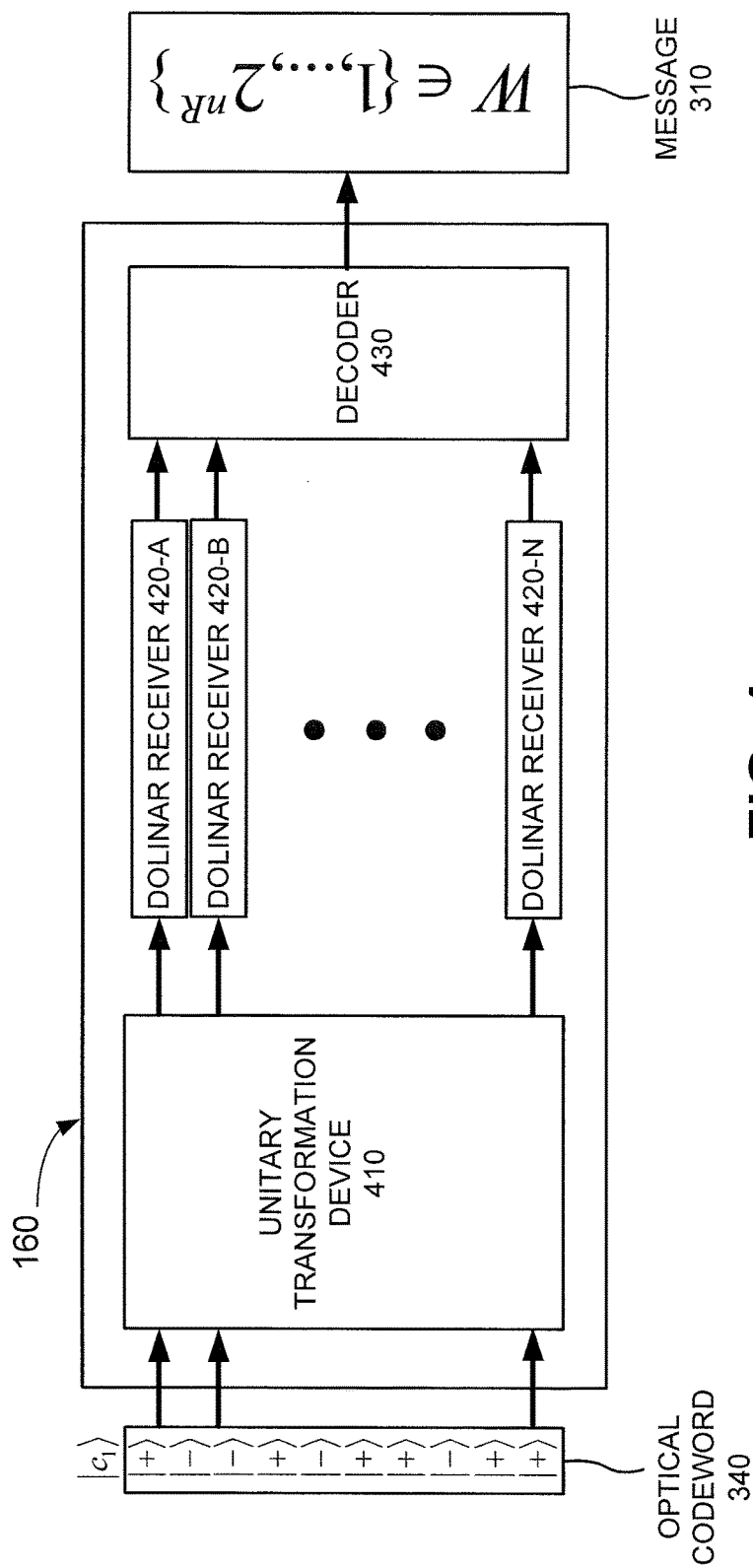
FIG. 4 is a diagram illustrating example components of a superadditive joint-detection receiver according to an implementation described herein.

FIG. 4 is a diagram illustrating example components of FSO receiver 160. As shown in FIG. 4, FSO receiver 160 may include a unitary transformation device 410, one or more Dolinar receivers 420-A to 420-N (referred to herein collectively as "Dolinar receivers 420" and individually as "Dolinar receiver 420"), and a decoder 430.

Unitary transformation device 410 may receive optical codeword 340 and may perform a unitary transformation in the optical domain on the received optical codeword 340. The unitary transformation may correspond to a joint operation performed on all the symbols of the received optical codeword 340 simultaneously. Unitary transformation device 410 may output a transformed (and possibly entangled) optical quantum state of the received optical codeword 340. While the received optical codeword 340 may correspond to a set of pure coherent-state BPSK symbols $|+a\rangle$ and $|-a\rangle$ (e.g., optical states corresponding to two different phases), the transformed optical codeword may correspond to states which may not be pure BPSK symbols $|+a\rangle$ and $|-a\rangle$, but rather may correspond to linear combinations of $|+a\rangle$ and $|-a\rangle$ (e.g., superpositions of $|+a\rangle$ and $|-a\rangle$). Unitary transformation device 410 may forward individual symbols associated with the transformed optical codeword to particular ones of Dolinar receivers 420.

Dolinar receiver 420 may convert the received optical symbol into an electrical signal corresponding to an estimate of whether the received optical symbol, of the transformed optical codeword, corresponds to a $|+a\rangle$ symbol or a $|-a\rangle$ symbol. Dolinar receiver 420 is described below in more detail with reference to FIG. 5.

Decoder 430 may receive electrical signals from Dolinar receivers 420 and may combine the received electrical signals into an estimate of an n-bit particular codeword of the codebook. Decoder 430 may then use a 1-1 map to generate an estimate of k-bit message 310 corresponding to the n-bit estimated codeword.

Although FIG. 4 shows example components of FSO receiver 160, in other implementations, FSO receiver 160 may include fewer components, different components, differently arranged components, and/or additional components than depicted in FIG. 4. Additionally or alternatively, one or more components of FSO receiver 160 may perform one or more tasks described as being performed by one or more other components of FSO receiver 160.

Figure 5:
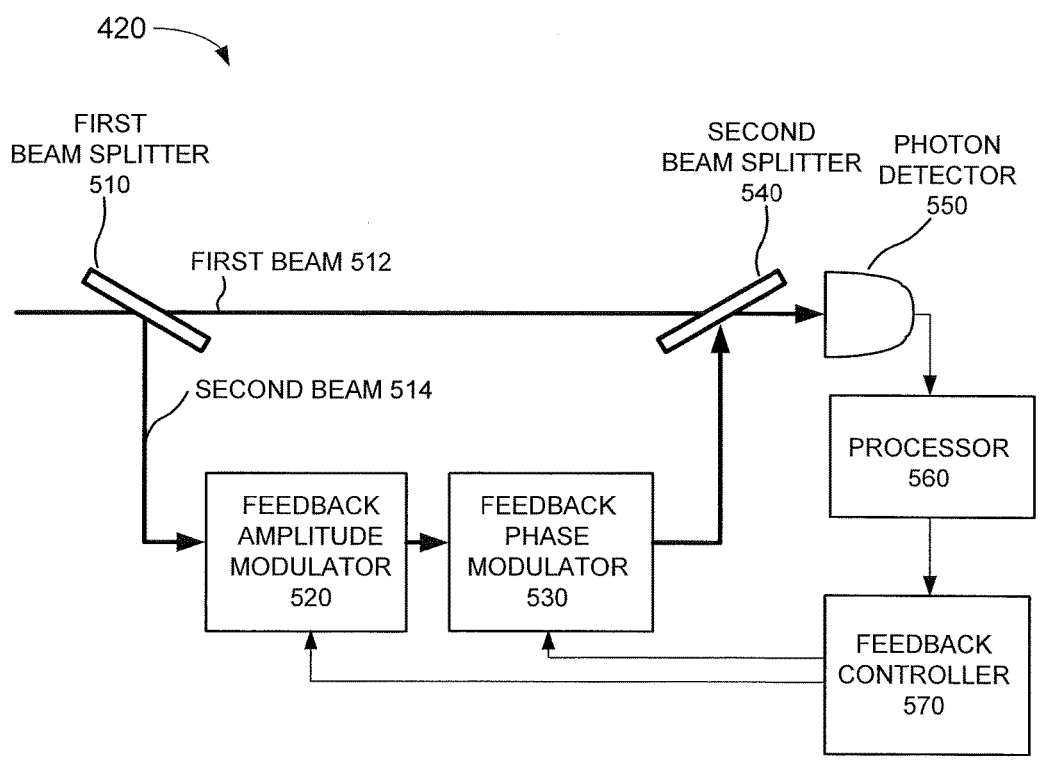
FIG. 5 is a diagram illustrating example components of a Dolinar receiver according to an implementation described herein.

FIG. 5 is a diagram illustrating example components of Dolinar receiver 420. Dolinar receiver 420 may correspond to an optimum quantum mechanical receiver for detecting one of two possible binary coherent states. Dolinar receiver 420 may add a time-varying local field to an incoming signal field and may perform photon counting on the combined field. The local field may be controlled by a feedback loop that adjusts an amplitude and a phase of the local field based on the observed photon counts. Dolinar receiver 420 may select one of two hypothesis $H_0$ and $H_1$, where selecting $H_0$ may correspond to detecting $|-a\rangle$, and where selecting $H_1$ may correspond to detecting $|+a\rangle$. For example, if Dolinar receiver 420 counts x photons within a particular time period, and x is 0 or an even number, Dolinar receiver 420 may select $H_1$, and if x is an odd number, Dolinar receiver 420 may select $H_0$.

As shown in FIG. 5, Dolinar receiver 420 may include a first beam splitter 510, a feedback amplitude modulator 520, a feedback phase modulator 530, a second beam splitter 540, a photon detector 550, a processor 560, and a feedback controller 570.

First beam splitter 510 may split an incoming light beam into a first beam 512 and a second beam 514. Second beam 514 may correspond to a local field controlled by feedback controller 570. Feedback amplitude modulator 520 may control an amplitude associated with second beam 514 based on signals received from feedback controller 570. Feedback phase modulator 530 may control a phase associated with second beam 514 based on signals received from feedback controller 570.

Second beam splitter 540 may combine first beam 512 and locally modulated second beam 514. Photon detector 550 may receive the combined beam from second beam splitter 540 and may perform a photon count on the received beam. For example, photon detector 550 may determine a number of photons detected within a particular time period.

Processor 560 may receive a photon count from photon detector 550 and may select one of two hypothesis $H_0$ and $H_1$, where selecting $H_0$ may correspond to detecting $|-a\rangle$, and where selecting $H_1$ may correspond to detecting $|+a\rangle$, based on the observed photon count. Feedback controller 570 may control feedback amplitude modulator 520 and feedback phase modulator 530 based on the observed photon count.

Although FIG. 5 shows example components of Dolinar receiver 420, in other implementations, Dolinar receiver 420 may include fewer components, different components, differently arranged components, and/or additional components than depicted in FIG. 5. Additionally or alternatively, one or more components of Dolinar receiver 420 may perform one or more tasks described as being performed by one or more other components of Dolinar receiver 420. In alternative implementations, a receiver other than a Dolinar receiver may be used. For example, in the context of Reed Muller codes, a Kennedy receiver may be used instead of a Dolinar receiver.

In other example implementations, FSO receiver 160 may use different type of receivers. For example, FSO receiver 160 may use Kennedy receivers. A Kennedy receiver may add a local field to a received signal field without the use of a feedback loop. Rather, in a Kennedy receiver, the amplitude and phase of the local field may be set to correspond to $H_0$.

Figure 6:
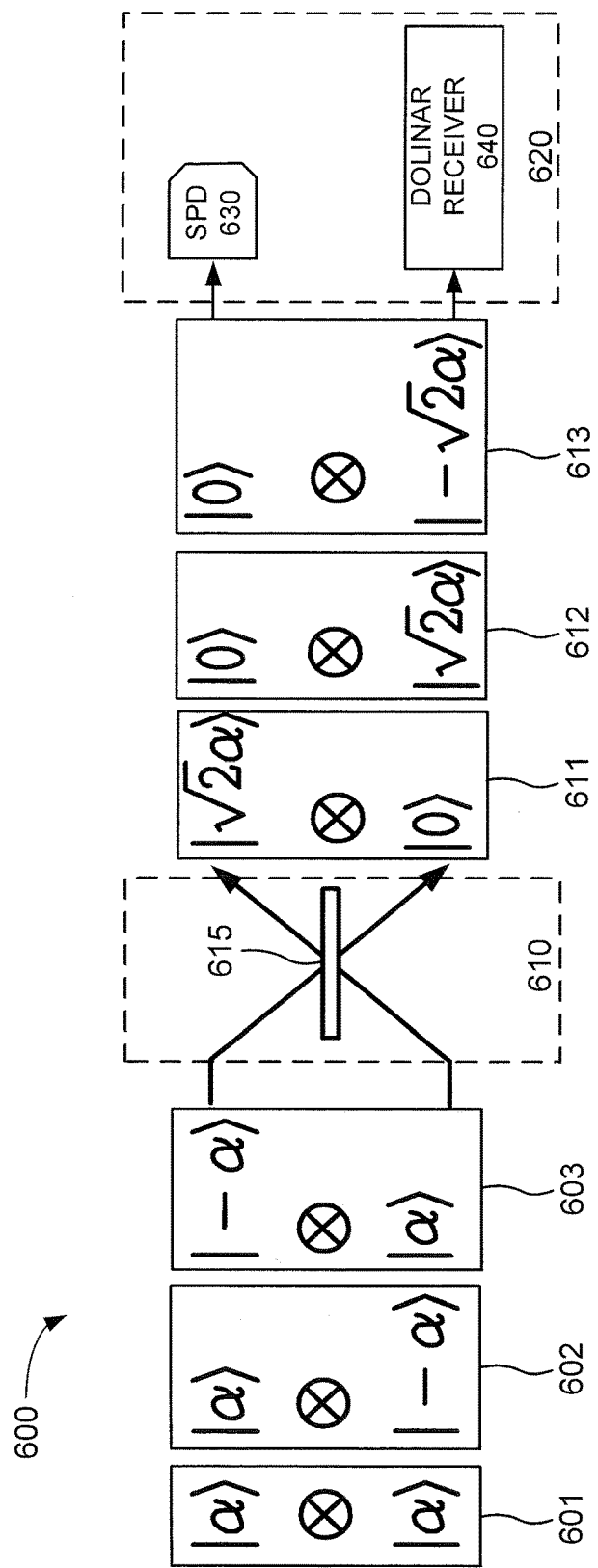
FIG. 6 is a diagram illustrating example components of a first example receiver according to an implementation described herein.

FIG. 6 is a diagram illustrating example components of a first example receiver 600 capable of being used by FSO receiver 160. As shown in FIG. 6, receiver 600 may include a unitary transformation operator 610 and a projective measurement receiver 620.

Unitary transformation operator 610 may correspond to a unitary transformation on a codebook that includes three codewords 601, 602, and 603. Codeword 601 may correspond to $|\psi_1\rangle = |\alpha\rangle \otimes |\alpha\rangle$, codeword 602 may correspond to $|\psi_2\rangle = |\alpha\rangle \otimes |-\alpha\rangle$, and codeword 603 may correspond to $|\psi_3\rangle = |-\alpha\rangle \otimes |-\alpha\rangle$. Unitary transformation operator 610 may include a beam splitter 615.

Beam splitter 615 may include a device with two input modes and two output modes and may separate an incident beam of light into a reflected beam and a transmitted beam. Beam splitter 615 may be implemented as two right-angle prisms, cemented together at their hypotenuse, with the hypotenuse surface being coated with a metallic or dielectric layer.

Beam splitter 615 may take as input two quantum symbols and may output two quantum symbols that are a superposition of the two input quantum symbols. Thus, beam splitter 615 may perform a unitary transformation on an incoming codeword to generate a transformed (and possibly entangled) codeword. For example, beam splitter 615 may transform first codeword 601 to first transformed codeword 611 corresponding to $|\phi_1\rangle = |\sqrt{2}\alpha\rangle \otimes |0\rangle$, may transform second codeword 602 to second transformed codeword 612 corresponding to $|\phi_2\rangle = |0\rangle \otimes |\sqrt{2}\alpha\rangle$, and may transform third codeword 603 to third transformed codeword 613 corresponding to $|\phi_3\rangle = |0\rangle \otimes |-\sqrt{2}\alpha\rangle$.

Projective measurement receiver 620 may include a single photon detector 630 and a Dolinar receiver 640. Projective measurement receiver 620 may perform a measurement on a transformed codeword and may determine to which codeword the transformed codeword corresponds.

Receiver 600 may achieve superadditive capacity gain in comparison to using a single Dolinar receiver (e.g., using Dolinar receiver 640 by itself). For example, using Dolinar receiver 640 by itself may result in a maximum photon efficiency of 2.8854 bits per photon, while receiver 600 may result in a maximum photon efficiency of 2.9572 bits per photon.

Although FIG. 6 shows example components of receiver 600, in other implementations, receiver 600 may include fewer components, different components, differently arranged components, and/or additional components than depicted in FIG. 6. Additionally or alternatively, one or more components of receiver 600 may perform one or more tasks described as being performed by one or more other components of receiver 600.

Figure 7:
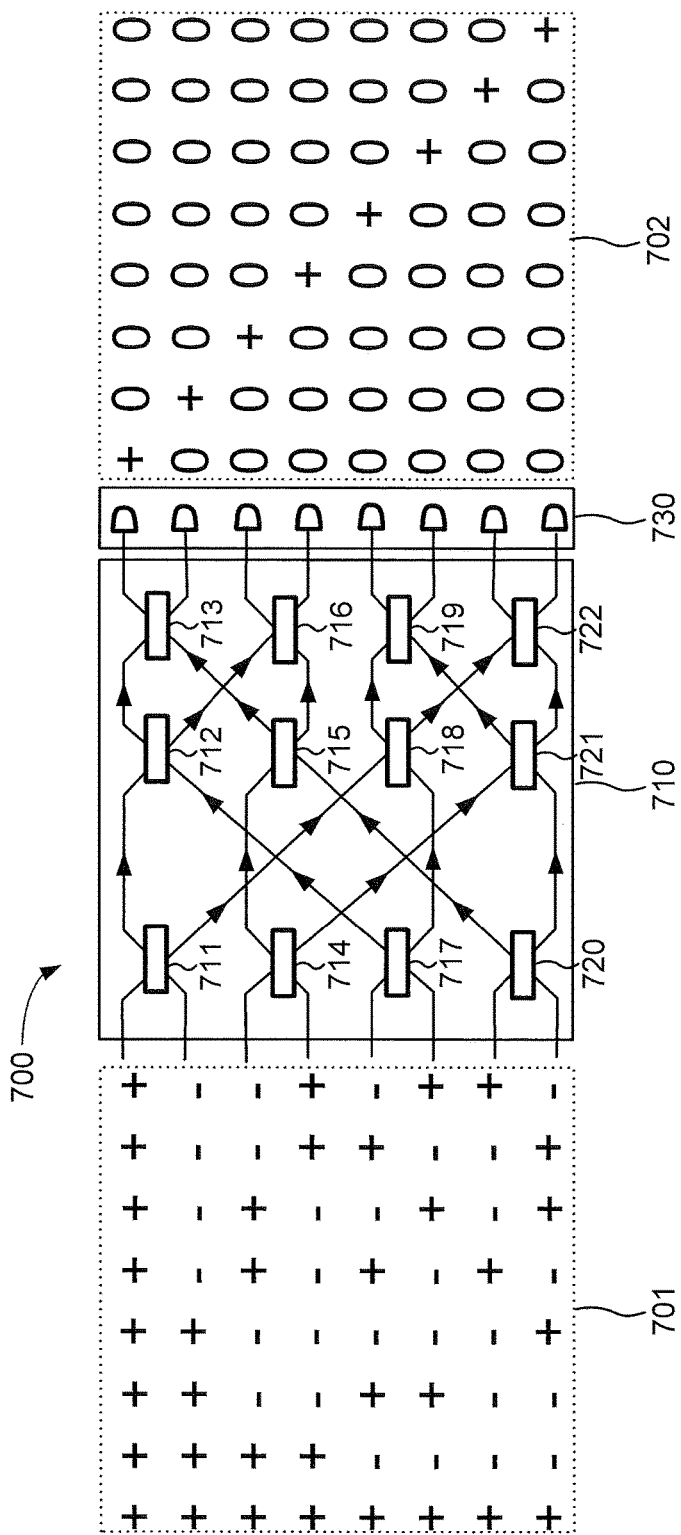
FIG. 7 is a diagram illustrating example components of a second example receiver according to an implementation described herein.

FIG. 7 is a diagram illustrating example components of a second receiver 700 capable of being used by FSO receiver 160. As shown in FIG. 7, receiver 700 may include a unitary transformation operator 710 and a projective measurement receiver 730.

Unitary transformation operator 710 may perform a unitary transformation on codewords based on a Hadamard matrix 701. The top row of Hadamard matrix 701 may correspond to an ancilla mode (e.g., a locally encoded signal that may facilitate the identification of errors in a received codeword). The use of an ancilla mode as part of a transmitted codeword may prevent receiver 700 from having to perform active-phase tracking and may improve performance of receiver 700.

Unitary transformation operator 710 may include a group of beam splitters 711-722. If the input of unitary transformation operator 710 includes a codeword with n optical symbols, then unitary transformation operator 710 may include $n*\log_2(n/2)$ beam splitters. Each of beam splitters 711-722 may take as input two quantum symbols of a codeword and may output two different quantum symbols.

Projective measurement receiver 730 may perform projective measurements on particular symbols of the transformed optical codeword. The projective measurements may include multiple single photon detectors. A particular single photon detector may perform photon counts for a particular output of unitary transformation operator 710.

Given Hadamard matrix 701, unitary transformation operator 710 may, in combination with projective measurement receiver 730, output pulse position modulation matrix 702. Thus, unitary transformation operator 701 may perform a unitary operation that corresponds to a Walsh transform.

As an example, using receiver 700 with a 2048 input by 2048 output that includes 11,264 beam splitters ($2048*\log_2(2048)/2=11,264$), together with 2048 single photon detectors, may attain a capacity of 10 bits per photon using BPSK modulation at a mean photon number per BPSK symbol of only $10^{-4}$.

Although FIG. 7 shows example components of receiver 700, in other implementations, receiver 700 may include fewer components, different components, differently arranged components, and/or additional components than depicted in FIG. 7. Additionally or alternatively, one or more components of receiver 700 may perform one or more tasks described as being performed by one or more other components of receiver 700.

Figure 8:
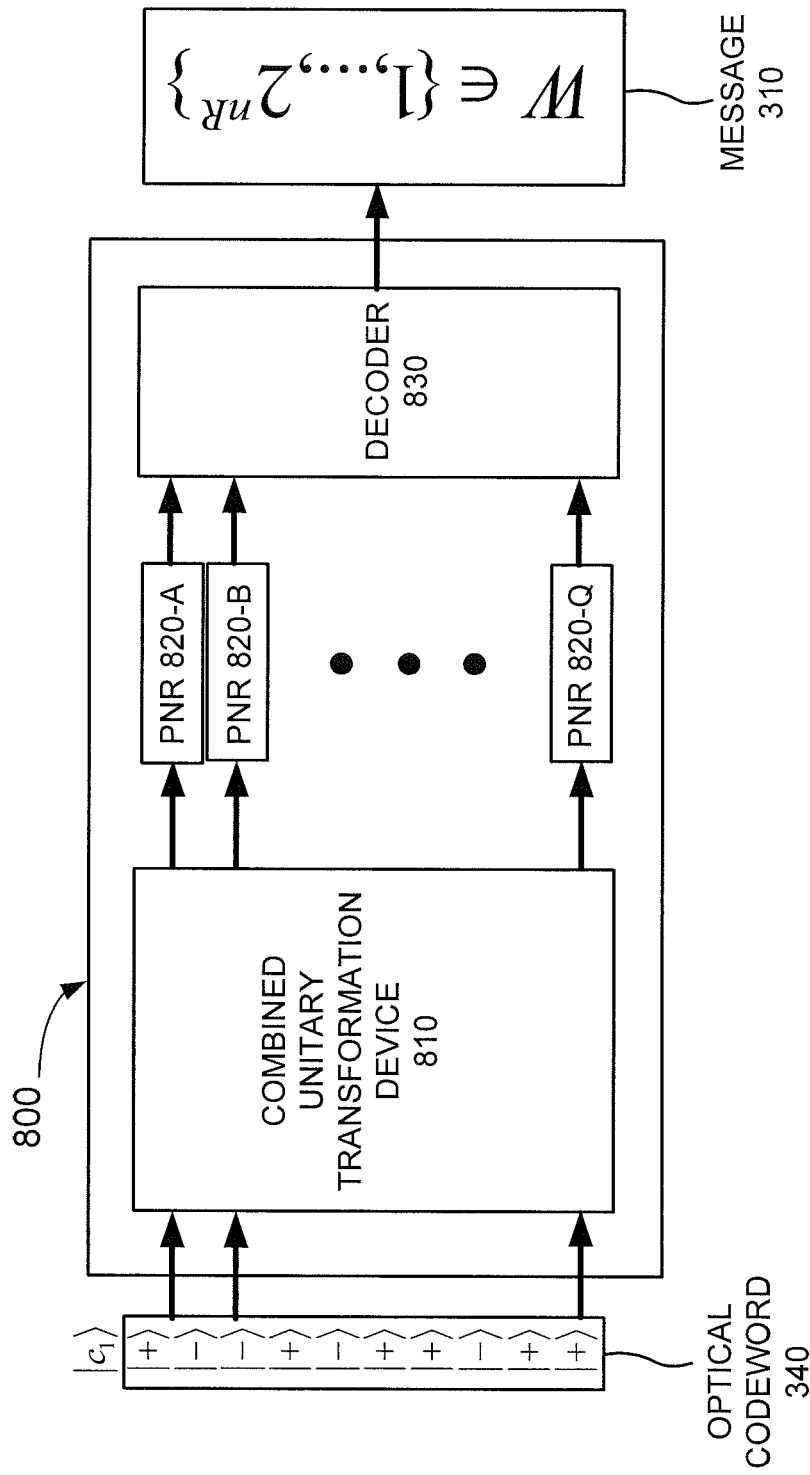
FIG. 8 is a diagram illustrating example components of a third example receiver according to an implementation described herein.

FIG. 8 is a diagram illustrating example components of a third receiver 800 capable of being used by FSO receiver 160. Dolinar receiver 420 may be implemented as a concatenation of a single mode unitary operation and a photon number resolving (PNR) detector. Single mode unitary operations corresponding to multiple Dolinar receivers 420 may be subsumed into a combined unitary operation acting on a codebook. Thus, in another implementation, FSO receiver 160, which includes a unitary transformation operator in combination with a group of Dolinar receivers, may be implemented as a combined unitary operation on a received codeword, followed by detection with an array of PNR detectors. Receiver 800 may correspond to a device that includes a combined unitary transformation operator. As shown in FIG. 8, receiver 800 may include a combined unitary transformation device 810, one or more PNR detectors 820-A to 820-Q (referred to herein collectively as "PNR detectors 820" and individually as "PNR detectors 820"), and a decoder 830.

Combined unitary transformation device 810 may perform a combined unitary transformation on optical codeword 340, where the combined unitary transformation corresponds to a unitary transformation performed by unitary transformation device 410 followed by a series of single mode unitary transformations on particular symbols of a transformed optical codeword.

PNR detectors 820 may detect photons corresponding to particular symbols of the transformed optical codeword and may perform a photon count associated with a particular symbol. For example, PNR detector 820 may count a number of photons detected for the particular symbol and may determine whether the particular symbol corresponds to BPSK symbol |+a⟩ or BPSK symbol |−a⟩ based on a number of photons detected. Decoder 830 may correspond to decoder 430 of FIG. 4.

Although FIG. 8 shows example components of receiver 800, in other implementations, receiver 800 may include fewer components, different components, differently arranged components, and/or additional components than depicted in FIG. 8. Additionally or alternatively, one or more components of receiver 800 may perform one or more tasks described as being performed by one or more other components of receiver 800.

Figure 9:
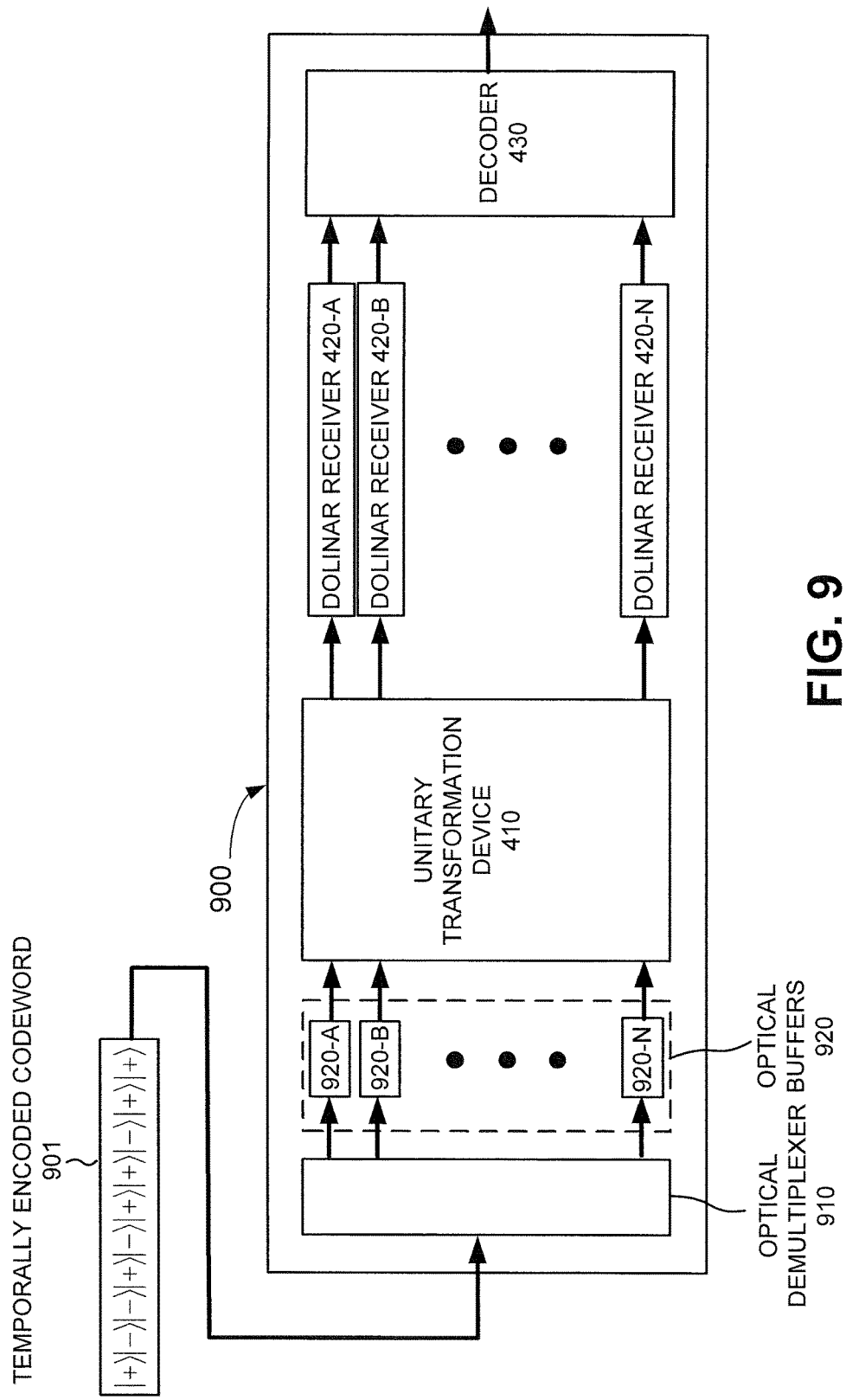
FIG. 9 is a diagram illustrating example components of a fourth example receiver according to an implementation described herein.

FIG. 9 is a diagram illustrating example components of a fourth receiver 900 capable of being used by FSO receiver 160. While implementations described herein correspond to receivers using spatial encoding (e.g., an n number of orthogonal spatial modes with n symbols transmitted simultaneously), receiver 900 may correspond to an implementation using temporal coding (e.g., one spatial mode with one symbol transmitted at a time). Thus, while receiver 400 (or receiver 800) may receive an n-symbol codeword in one pulse, receiver 900 may receive an n-symbol codeword in n pulses.

As shown in FIG. 9, receiver 900 may include an optical demultiplexer 910, one or more optical buffers 920-A to 920-N (referred to herein collectively as "optical buffers 920" and individually as "optical buffer 920"), unitary transformation device 410, one or more Dolinar receivers 420-A to 420-N, and decoder 430.

Optical demultiplexer 910 may receive a temporally encoded codeword 901 one symbol at a time and may select optical buffers 920 in sequence. Thus, optical demultiplexer 910 may send a first symbol to optical buffer 920-A, a second symbol to optical buffer 920-B, and so on until optical buffer 920-N receives the n-th symbol.

Optical buffers 920 may temporarily store particular symbols of temporally encoded codeword 901. In one example, optical buffers 920 may include optical paths (e.g., optical fibers) of different lengths so that when the n-th symbol is received by optical buffer 920-N, all n symbols are forwarded to unitary transformation device 410 at substantially the same time. For example, optical buffer 920-A may include an optical path that is longer than the optical path of optical buffer 920-B, the optical path of optical buffer 920-B may include an optical path that is longer than the optical path of optical buffer 920-C, and so on, with optical buffer 920-N having a shortest optical path. In another example, optical buffers 920 may include slow light devices configured so that all n optical symbols exit optical buffers 920 at substantially the same time.

Unitary transformation device 410, Dolinar receivers 420, and decoder 430 may correspond to unitary transformation device 410, Dolinar receivers 420, and decoder 430 of FIG. 4, respectively.

Although FIG. 9 shows example components of receiver 900, in other implementations, receiver 900 may include fewer components, different components, differently arranged components, and/or additional components than depicted in FIG. 9. Additionally or alternatively, one or more components of receiver 900 may perform one or more tasks described as being performed by one or more other components of receiver 900.

Figure 10:
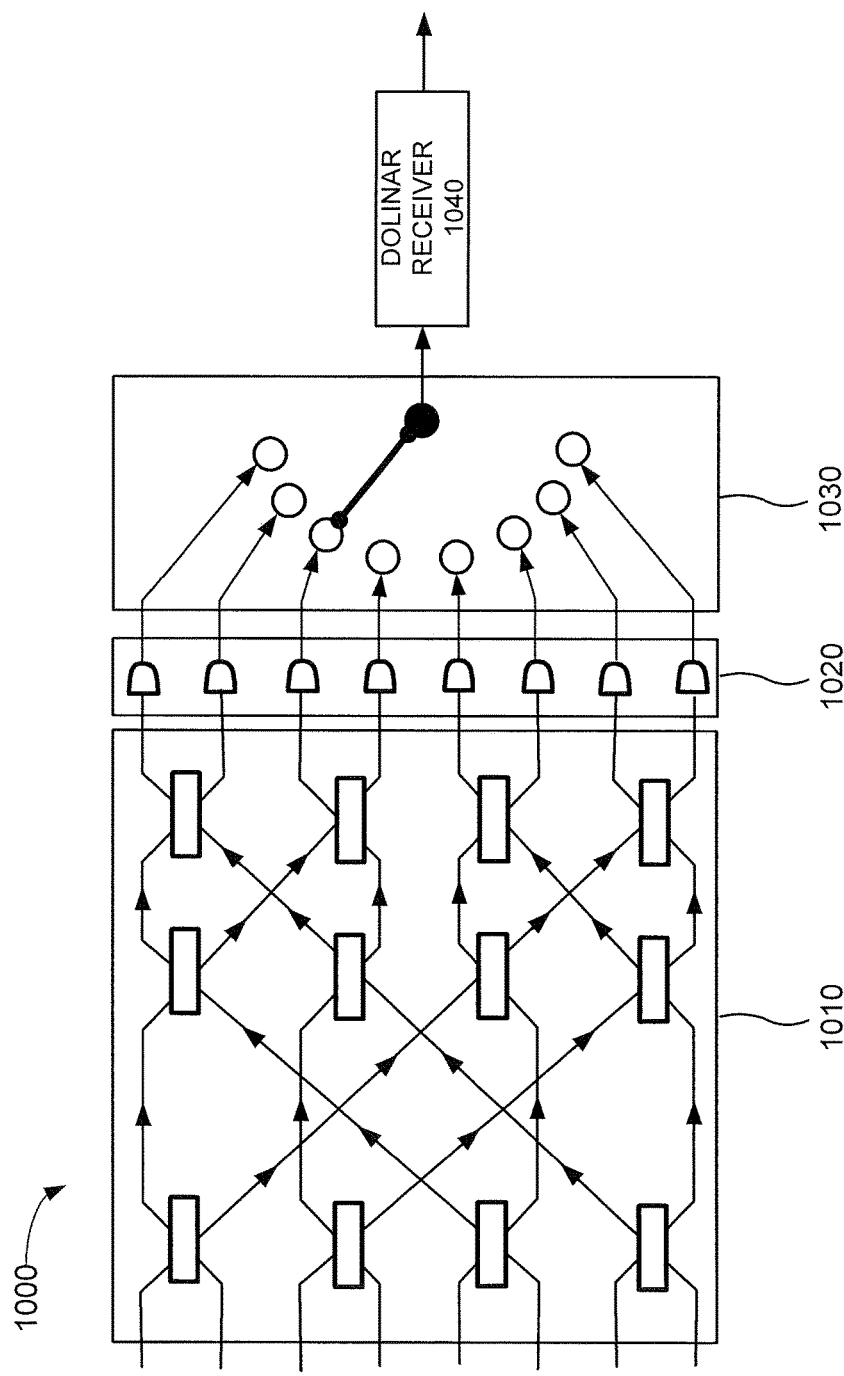
FIG. 10 is a diagram illustrating example components of a fifth example receiver according to an implementation described herein.

FIG. 10 is a diagram illustrating example components of a fifth receiver 1000 capable of being used by FSO receiver 160. Receiver 1000 may detect codewords encoded using a first-order Reed-Muller code R(1,m). A Reed-Muller code R(r,m) may correspond to a [n, k, d] linear code ($0 \leq r \leq m$), where $n=2^m$ is the length of each codeword, with $K=2^k$ codewords in the code, and with a minimum distance, in the code space, of $d=2^{m-r}$ between any two codewords.

First order Reed-Muller code R(1,m) may be a $[2^m, m+1, 2^{m-1}]$ code that corresponds to a $[2^m, m, 2^{m-1}]$ Hadamard code, including an ancilla, with the same codewords with flipped bits. An R(1,m) code, similar to a Hadamard code, may be decoded in the optical domain using a joint detection receiver with n $\log_2$ n/2 beamsplitters (where $n=2^m$), followed by an array of n single photon detectors, followed by a single Dolinar receiver.

As shown in FIG. 10, receiver 1000 may include a unitary transformation operator 1010, a projective measurement receiver 1020, a switch 1030, and a Dolinar receiver 1040. Unitary transformation operator 1010 may perform a unitary transformation on codewords, analogous to unitary transformation operator 710 of FIG. 7. Projective measurement receiver 1020 may include a group of single photon detectors that perform photon counts for a particular output of unitary transformation operator 1010, analogous to projective measurement receiver 730. Dolinar receiver 1040 may include a Dolinar receiver analogous to Dolinar receiver 640. Dolinar receiver 1040 may be switchable, via switch 1030, to any of the single photon detectors of projective measurement receiver 1020.

When a codeword is received by receiver 1000, a particular one of the single photon detectors, of projective measurement receiver 1020, may click (e.g., detect a photon). The particular single photon detector that clicks may trigger Dolinar receiver 1040. If none of the single photon detectors clicks, receiver 1000 may yield an erasure outcome, indicating that receiver 1000 was not able to determine which particular codeword was received.

Receiver 1000, which may decode codewords based on a first order BPSK Reed-Muller codebook, may outperform a detector based on direct detection of on-off keying. Furthermore, receiver 1000 may exhibit superadditive capacity for a BPSK alphabet, with a higher capacity than a codebook in the Hadamard codebook family.

Although FIG. 10 shows example components of receiver 1000, in other implementations, receiver 1000 may include fewer components, different components, differently arranged components, and/or additional components than depicted in FIG. 10. Additionally or alternatively, one or more components of receiver 1000 may perform one or more tasks described as being performed by one or more other components of receiver 1000.

Figure 11:
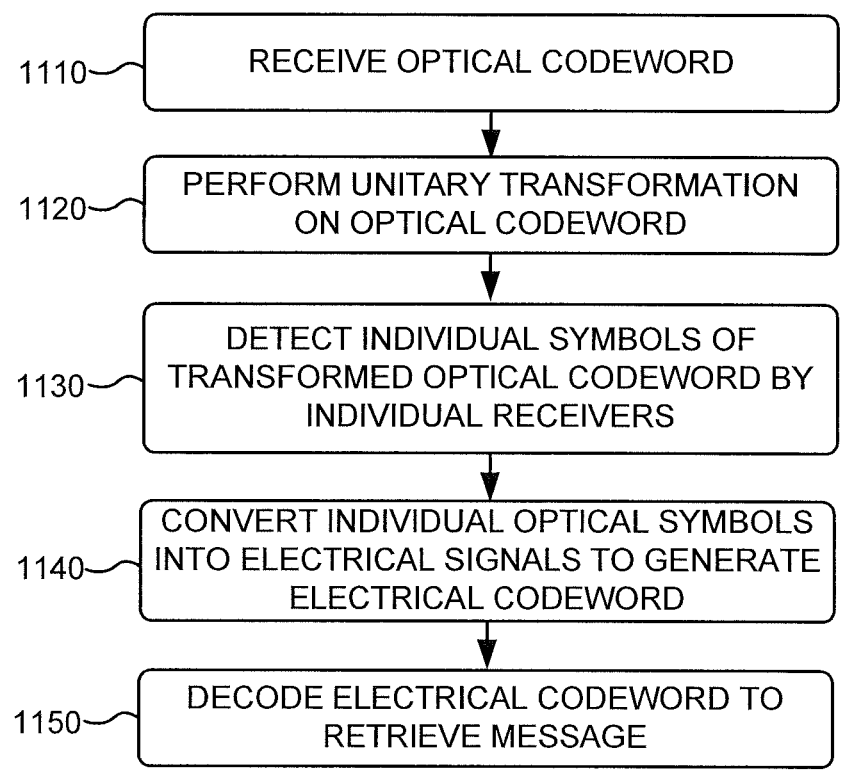
FIG. 11 is a flow chart of an example process for performing a superadditive measurement of a received codeword according to an implementation described herein.

FIG. 11 is a flow chart of an example process for performing a superadditive measurement of a received codeword according to an implementation described herein. In one implementation, the process of FIG. 11 may be performed by FSO receiver 160. In other implementations, some or all of the process of FIG. 11 may be performed by another device or a group of devices separate and/or possibly remote from or including FSO receiver 160.

The process of FIG. 11 may include receiving an optical codeword (block 1110). For example, FSO receiver 160 may received an optical codeword based on modulated light signal 150. The codeword may be received by unitary transformation device 410.

A unitary transformation may be performed on the received optical codeword (block 1120). For example, unitary transformation device 410 may perform a unitary transformation on the received optical codeword. Unitary transformation device 410 may output a transformed (and possibly entangled) optical quantum state of the received optical codeword. While the received optical codeword may correspond to a set of pure BPSK symbols $|+a\rangle$ and $|-a\rangle$ (e.g., photon states corresponding to two different phases), the transformed optical codeword may correspond to states which may not be pure BPSK symbols $|+a\rangle$ and $|-a\rangle$, but may rather correspond to linear combinations of $|+a\rangle$ and $|-a\rangle$ (e.g., superpositions of $|+a\rangle$ and $|-a\rangle$).

Individual symbols of the transformed optical codeword may be detected by individual receivers (block 1130). For example, unitary transformation device 410 may forward individual symbols associated with the transformed optical codeword to particular ones of Dolinar receivers 420. Each of Dolinar receivers 420 may detect a particular transformed symbol (e.g., corresponding to a particular linear combination of $|+a\rangle$ and $|-a\rangle$.

The individual optical symbols may be converted into electrical signals to generate an electrical codeword (block 1140). For example, a particular Dolinar receiver 420 may convert the detected optical symbol into an electrical signal corresponding to an estimate of whether the received optical symbol corresponds to a $|+a\rangle$ symbol or a $|-a\rangle$ symbol.

The electrical codeword may be decoded to retrieve a message (block 1150). For example, decoder 430 may receive the electrical signals from Dolinar receivers 420 and may combine the received electrical signals into an estimate of an n-symbol particular codeword of the codebook. Decoder 430 may then use a 1-1 map to generate an estimate of a k-bit message corresponding to the n-symbol estimated codeword.

Figure 12:
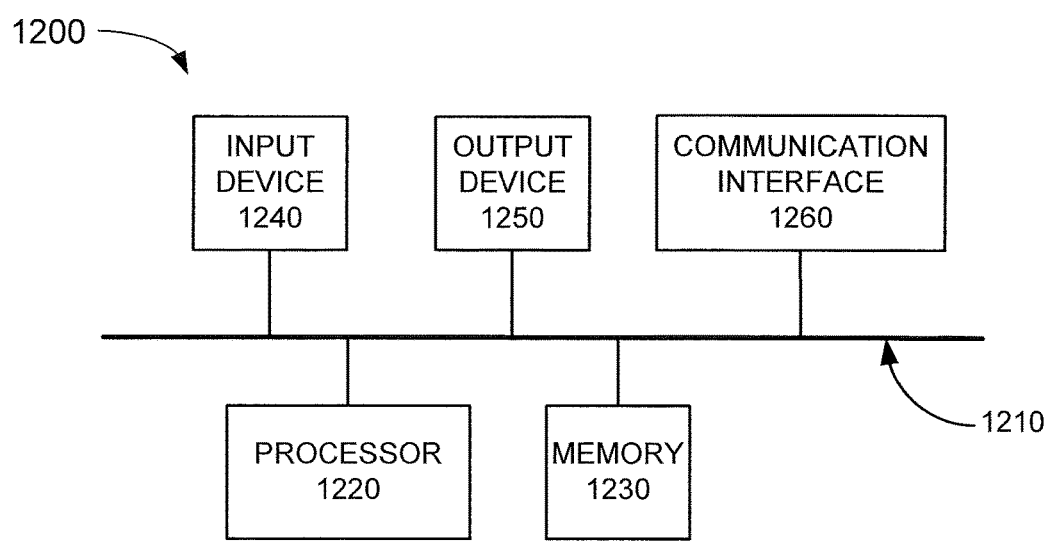
FIG. 12 is a diagram of example components of a computer device according to an implementation described herein.

FIG. 12 is a diagram illustrating example components of a computer device 1200 that may be used to generate a unitary transformation matrix corresponding to unitary transformation device 410, that may be used to generate a combined unitary transformation matrix corresponding to combined unitary transformation device 810, or that may be used to generate a layout for a photonic circuit based on a particular unitary transformation matrix. As shown in FIG. 12, computer device 1200 may include a bus 1210, a processor 1220, a memory 1230, an input device 1240, an output device 1250, and a communication interface 1260.

Bus 1210 may include a path that permits communication among the components of computer device 1200. Processor 1220 may include one or more processors, microprocessors, or processing logic (e.g., application specific integrated circuits (ASICs) or field programmable gate arrays (FPGAs)) that may interpret and execute instructions. Memory 1230 may include a random access memory (RAM) device or another type of dynamic storage device that may store information and instructions for execution by processor 1220, a read only memory (ROM) device or another type of static storage device that may store static information and instructions for use by processor 1220, a magnetic and/or optical recording memory device and its corresponding drive, and/or a removable form of memory, such as a flash memory.

Input device 1240 may include a mechanism that permits an operator to input information to computer device 1200, such as a keypad, a button, a pen, a touch screen, voice recognition and/or biometric mechanisms, etc. Output device 1250 may include a mechanism that outputs information to the operator, including one or more light indicators, a display, a speaker, etc.

Communication interface 1260 may include any transceiver-like mechanism that enables computer device 1200 to communicate with other devices and/or systems. For example, communication interface 1260 may include a modem, a network interface card, and/or a wireless interface card.

As described herein, computer device 1200 may perform certain operations. Computer device 1200 may perform these operations in response to processor 1220 executing software instructions contained in a computer-readable medium, such as memory 1230. A computer-readable medium may be defined as a non-transitory memory device. A memory device may include space within a single physical memory device or spread across multiple physical memory devices.

The software instructions may be read into memory 1230 from another computer-readable medium, or from another device via communication interface 1260. The software instructions contained in memory 1230 may cause processor 1220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 12 shows example components of computer device 1200, in other implementations, computer device 1200 may contain fewer components, different components, additional components, or differently arranged components than depicted in FIG. 12. Additionally or alternatively, one or more components of computer device 1200 may perform one or more tasks described as being performed by one or more other components of computer device 1200.

Figure 13:
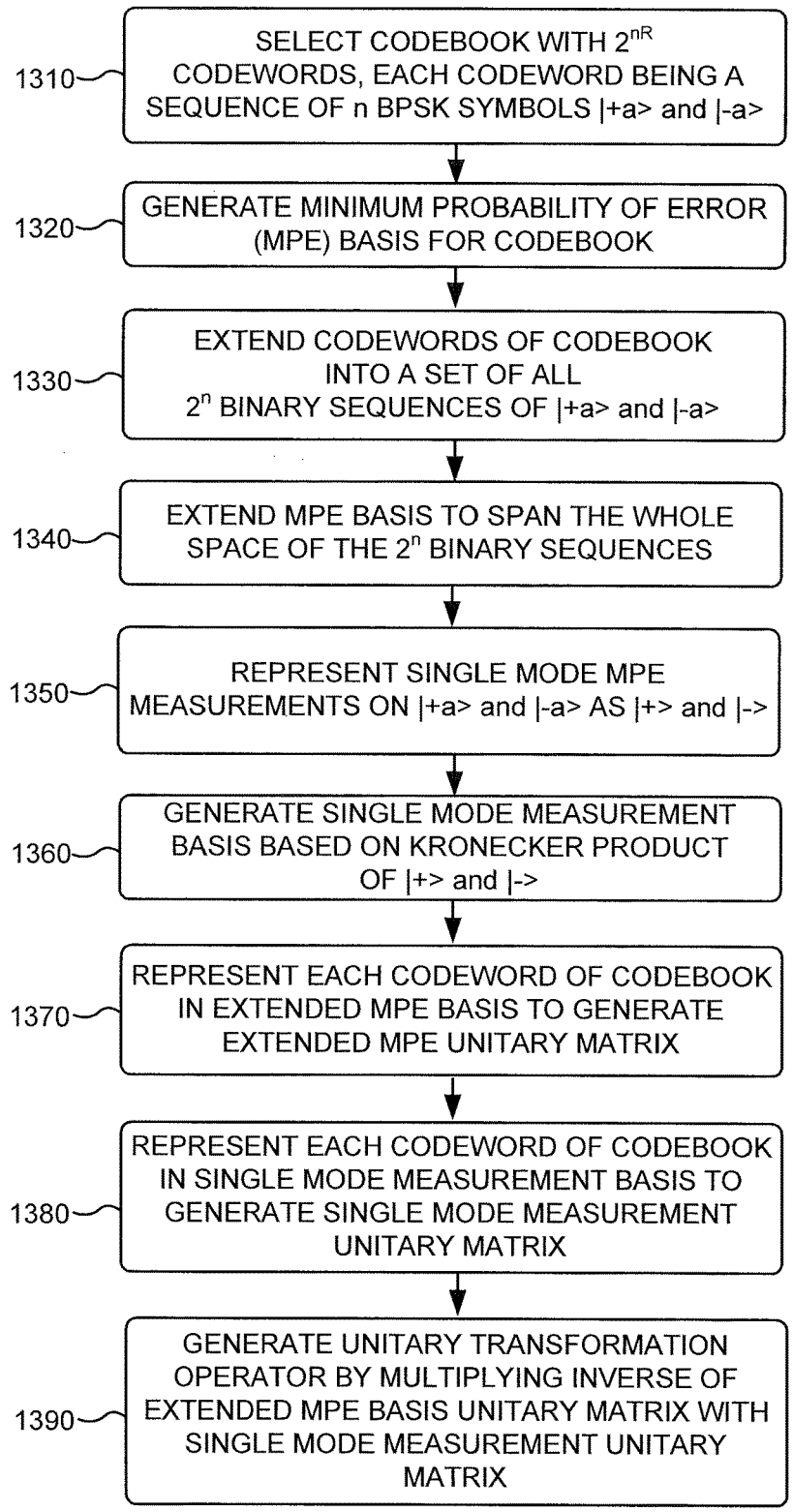
FIG. 13 is a flow chart of an example process for generating a unitary transformation operator for a codebook according to an implementation described herein.

FIG. 13 is a flow chart of an example process for generating a unitary transformation operator for a codebook according to an implementation described herein. In one implementation, the process of FIG. 13 may be performed by computer device 1200. In other implementations, some or all of the process of FIG. 13 may be performed by another device or a group of devices separate and/or possibly remote from or computer device 1200.

The process of FIG. 13 may include selecting a codebook with $2^{nR}$ codewords, each codeword being a sequence of n BPSK symbols $|+a\rangle$ and $|-a\rangle$ (block 1310). For example, computer device 1200 may select a particular codebook C of n BPSK symbols. Each codeword may include a particular sequence of n BPSK symbols $|+a\rangle$ and $|-a\rangle$, with $|+a\rangle$ and $|-a\rangle$ corresponding to two different binary states. For example, $|+a\rangle$ may correspond to a first phase of a photon and $|-a\rangle$ may correspond to a second phase of a photon, where the second phase differs from the first phase by 180°. The number of codewords may correspond to $K=2^{nR}$, where n corresponds to the number of symbols per codeword and where R corresponds to the transmission rate in bits per BPSK symbol.

An MPE basis for the codebook may be generated (block 1320). For example, computer device 1100 may calculate an MPE measurement on codebook C in terms of a set of projection operators $W_C = \{|w_1\rangle, |w_2\rangle, \ldots |w_k\rangle\}$. $W_C$ may form a complete ortho-normal (CON) basis of a vector space spanned by the codewords in C.

The codewords of codebook C may be extended into a set of all $2^n$ binary sequences of $|+a\rangle$ and $|-a\rangle$ (block 1330). For example, computer device 1200 may generate a set $C^E = \{|c_1\rangle, \ldots, |c_k\rangle, |c_{k+1}\rangle, \ldots, |c_q\rangle\}$, where $q = 2^n$. For example, if n=3, $C^E = \{\{|-a\rangle, |-a\rangle, |-a\rangle\}, \{|-a\rangle, |-a\rangle, |+a\rangle\}, \{|+a\rangle, |-a\rangle\}, \{|-a\rangle, |+a\rangle, |+a\rangle\}, \{|+a\rangle, |-a\rangle\}, \{|+a\rangle, |-a\rangle, |+a\rangle\}, \{|+a\rangle, |+a\rangle, |-a\rangle\}, \{|+a\rangle, |+a\rangle, |+a\rangle\}\}$.

The MPE basis may be extended to span the whole space of the $2^n$ binary sequences (block 1340). For example, computer device 1200 may extend basis $W_C$ to span the whole vector space spanned by $C^E$ using Gram-Schmidt ortho-normalization. Extended basis $W_C$ may be represented as basis $W = \{|w_1\rangle, \ldots |w_k\rangle, |w_{k+1}\rangle, \ldots, |w_q\rangle\}$.

Single mode MPE measurements on $|+a\rangle$ and $|-a\rangle$ may be represented as $|+\rangle$ and $|-\rangle$ (block 1350). For example, computer device 1200 may represent a single mode MPE measurement on $|+a\rangle$ and $|-a\rangle$, which may correspond to a detection by a Dolinar receiver or a Sasaki-Hirota receiver, in terms of two projectors on the span of the two BPSK states $|+a\rangle$ and $|-a\rangle$. The two projectors, $|+\rangle$ and $|-\rangle$, may each correspond to a linear combination of the two pure states $|+a\rangle$ and $|-a\rangle$. In other words, $|+\rangle = a_1|+a\rangle + a_2|-a\rangle$, and $|-\rangle = b_1|+a\rangle b_2 |-a\rangle$.

A single mode measurement basis may be generated based on Kronecker products of $|+\rangle$ and $|-\rangle$) (block 1360). For example, computer device 1200 may construct a complete ortho-normal basis M of the vector space spanned by $C^E$ using a Kronecker product of $|+\rangle$ and $|-\rangle$). In other words, $M = \{|m_1\rangle, |m_2\rangle, \ldots |m_q\rangle\}$, where $|m_1\rangle = |+\rangle|+\rangle \ldots |+\rangle|+\rangle$, $|m_2\rangle = |+\rangle \ldots |+\rangle|-\rangle$, $|m_3\rangle = |+\rangle|+\rangle \ldots |-\rangle|+\rangle$, $|m_4\rangle = |+\rangle|+\rangle \ldots |-\rangle|-\rangle, \ldots, |m_q\rangle = |-\rangle|-\rangle \ldots |-\rangle|-\rangle$.

Each codeword of codebook C may be represented in the extended MPE basis to generate an extended MPE unitary matrix (block 1370). For example, each code word $|c_k\rangle$ in $C^E$ may be expressed in basis W as $$|c_k\rangle = \sum_{j=1}^{q} \langle w_j | c_k \rangle |w_j\rangle,$$

and the extended MPE unitary matrix $U_W$ may be generated based on the set of coefficients, where $\langle w_j | c_k \rangle$ corresponds to the (j,k)$^{th}$ coefficient of $U_W$.

Each codeword of codebook C may be represented in the single mode measurement basis to generate a single measurement MPE unitary matrix (block 1380). For example, each code word $|c_k\rangle$ in $C^E$ may be expressed in basis M as $$|c_k\rangle = \sum_{j=1}^{q} \langle m_j | c_k \rangle |m_j\rangle,$$

and the single mode measurement MPE unitary matrix $U_M$ may be generated based on the set of coefficients, where $\langle m_j | c_k \rangle$ corresponds to the $(j,k)^{th}$ coefficient of $U_M$.

A unitary transformation operator may be generated by multiplying an inverse of the extended MPE basis unitary matrix with the single mode measurement unitary matrix (block 1290). For example, computer device 1200 may generate unitary transformation operator $$U = \sum_{k=1}^{q} \sum_{j=1}^{q} u_{jk} |m_j\rangle\langle m_k|,$$

where $u_{jk} = (U_W^{-1} U_M)_{jk}$ (represented in the M basis).

Figure 14:
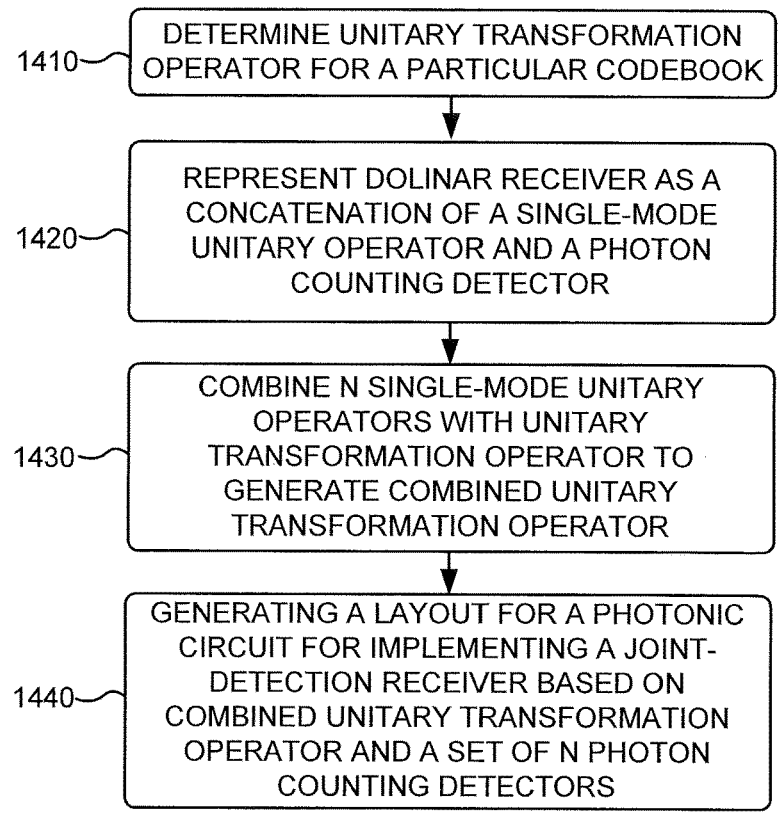
FIG. 14 is a flow chart of an example process for generating a combined unitary transformation operator according to an implementation described herein.

FIG. 14 is a flow chart of an example process for generating combined unitary transformation device 810 according to an implementation described herein. In one implementation, the process of FIG. 14 may be performed by computer device 1200. In other implementations, some or all of the process of FIG. 14 may be performed by another device or a group of devices separate and/or possibly remote from or computer device 1100.

The process of FIG. 14 may include determining a unitary transformation operator for a particular codebook (block 1410). For example, computer device 1200 may determine a unitary transformation matrix corresponding to unitary transformation device 410.

A Dolinar receiver may be represented as a concatenation of a single-mode unitary operator and a photon number resolving (PNR) detector (block 1420). For example, computer device 1200 may represent Dolinar receiver 420 as a combination of a single-mode unitary operator and a PNR detector. Computer device 1200 may generate a single mode unitary operator, in a same format as the unitary transformation matrix (e.g., in a same basis), for each of the Dolinar receivers 420-A through 420-N (e.g., may generate n single mode unitary operators).

The n single mode unitary operators may be combined with the unitary transformation operator to generate a combined unitary transformation operator (block 1430). For example, computer device 1200 may generate a matrix corresponding to the n single mode unitary operators and may generate a product of the unitary transformation matrix and the matrix corresponding to the n single mode unitary operators to generate a combined unitary transformation matrix (which corresponds to the combined unitary transformation operator).

A layout for a photonic circuit for implementing a joint-detection receiver based on the combined unitary transformation operator and a set of N photon counting detectors may be generated (block 1440). For example, computer device 1200 may generate a layout for a photonic circuit that corresponds to combined unitary transformation device 810 and n PNR detectors 820-A through 820-N.

Figure 15:
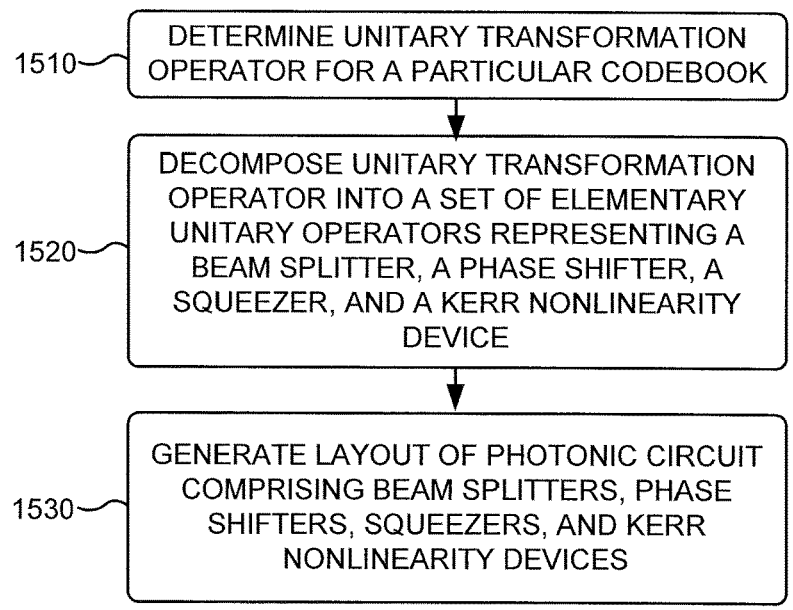
FIG. 15 is a flow chart of an example process for generating an optical circuit for a unitary transformation operator according to an implementation described herein.

FIG. 15 is a flow chart of an example process for generating an optical circuit for a unitary transformation operator according to an implementation described herein. In one implementation, the process of FIG. 15 may be performed by computer device 1200. In other implementations, some or all of the process of FIG. 15 may be performed by another device or a group of devices separate and/or possibly remote from or computer device 1200.

The process of FIG. 15 may include determining a unitary transformation operator for a particular codebook (block 1510). For example, computer device 1200 may determine a unitary transformation matrix that has been generated for codebook C using the process of FIG. 13.

The unitary transformation operator may be decomposed into a set of elementary unitary operators representing a beam splitter, a phase shifter, a squeezer, and a Kerr nonlinearity device (block 1520). Any optical unitary transformation on multiple optical modes may be accomplished using a combination of beam splitters, a phase shifter, a squeezer, and any third-order Hamiltonian operator, such as a device that includes a Kerr nonlinearity device. In another implementation, a third-order Hamiltonian operator may be implemented by a photon-number-resolving (PNR) detector.

A phase shifter may include a device, with one optical input and one optical output, which may introduce a variable phase delay into the optical input. In one implementation, a phase shifter may include one or more piezoelectric mirrors. In another implementation, a phase shifter may include a polaroptic phase shifter that is electrically tunable using a liquid crystal driver.

A squeezer may include a device with either one optical input and one optical output or two optical inputs and two optical outputs. A squeezer may reversibly transform an optical state in a manner that enables a measurement of one field quadrature of the optical output, with an accuracy higher than a vacuum noise fluctuation level, at a cost of being able to measure an orthogonal quadrature with a proportionately lower accuracy. Thus, the squeezer may squeeze a quadrature noise variance in one direction, while elongating the variance in another direction. A squeezer may be implemented using, for example, a nonlinear periodically poled lithium niobate (PPNL) or periodically poled potassium titanyl phosphate (PPKTP) crystal and a strong pump laser.

A Kerr nonlinearity device may include a device with two optical inputs and two optical outputs, which exhibits third-order nonlinear chi susceptibility. A Kerr nonlinearity device may be implemented using an atom, capable of an electromagnetically induced transparency, embedded inside a photonic crystal microcavity. The embedded atom may impart a pi-rad-peak phase shift in response to a single photon excitation. A Kerr nonlinearity device may implement an effect called a cross-Kerr effect or cross-phase modulation, and may be used for realizing an all-optical two-qubit control-NOT quantum logic gate.

Each of a beam splitter, phase shifter, squeezer, and Kerr nonlinearity device may be represented with a corresponding Hamiltonian operator. Any Hamiltonian operator may be decomposed to a linear combination of commutation operators. By decomposing the unitary transformation operator into a linear combination of commutation operators and expressing the linear combination of commutation operators as a combination of the set of Hamiltonians representing a beam splitter, a shifter, a squeezer, and a Kerr nonlinearity device, the unitary transformation operator may be expressed as a combination of operators corresponding to the set of a beam splitter, a shifter, a squeezer, and a Kerr nonlinearity device.

A layout of a photonic circuit may be generated comprising of beam splitters, phase shifters, squeezers, and Kerr nonlinearity devices (block 1530). For example, computer device 1200 may generate a layout of a photonic circuit, which corresponds to the unitary transformation operator, where the photonic circuit corresponds to a combination of beam splitters, phase shifters, squeezers, and Kerr nonlinearity devices.

The foregoing description provides illustration and description, but is not intended to be exhaustive or to limit the invention to the precise form disclosed. Modifications and variations are possible in light of the above teachings or may be acquired from practice of the invention.

For example, while series of blocks have been described with respect to FIGS. 11 and 13-15, the order of the blocks may be modified in other implementations. Further, non-dependent blocks may be performed in parallel.

Also, certain portions of the implementations may have been described as a "component" that performs one or more functions. The term "component" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

It should be emphasized that the term "comprises/comprising" when used in this specification is taken to specify the presence of stated features, integers, steps, or components, but does not preclude the presence or addition of one or more other features, integers, steps, components, or groups thereof.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed is:

1. A method for generating a combined unitary transformation device comprising
    generating, by a computer device, a single-mode unitary operator for a receiver;
    generating, by the computer device, a combined unitary transformation operator based on the single-mode unitary operator; and
    generating, by the computer device and based on the combined unitary transformation operator, a layout of a photonic circuit, for implementing a joint-detection receiver, that corresponds to two or more devices,
        the two or more devices including the combined unitary transformation device and a photo number resolving (PNR) detector.

2. The method of claim 1, where the receiver is a Dolinar receiver.

3. The method of claim 1, where generating the single-mode unitary operator comprises:
    generating the single-mode unitary operator in a same format as a Unitary transformation operator.

4. The method of claim 1, further comprising:
    representing the receiver as a combination of the single-mode unitary operator and the PNR detector.

5. The method of claim 1, where generating the combined unitary transformation operator comprises:
    generating a matrix based on the single-mode unitary operator, and
    generating the combined unitary transformation operator based on the matrix and a unitary transformation operator.

6. The method of claim 1, further comprising:
    determining a unitary transformation matrix corresponding to a unitary transformation device,
        where generating the combined unitary transformation operator comprises:
            generating the combined unitary transformation operator based on the unitary transformation matrix and the single-mode unitary operator.

7. The method of claim 6, where generating the combined unitary transformation operator comprises:
    generating a product of the unitary transformation matrix and a matrix corresponding to the single-mode unitary operator, and
    generating a combined unitary transformation matrix that corresponds to the combined unitary transformation operator.

8. The method of claim 1, where the two or more devices further include one or more other PNR detectors.

9. A non-transitory computer-readable medium, for generating a combined unitary transformation device, storing instructions, the instructions comprising:
    one or more instructions that, when executed by a processor, cause the processor to:
        generate a single-mode unitary operator for an optical receiver;
        generate a combined unitary transformation operator based on the single-mode unitary operator; and
        generate a layout of a photonic circuit, for implementing a joint-detection receiver, based on the combined unitary transformation operator,
            the layout of the photonic circuit corresponding to the combined unitary transformation device and a photo number resolving (PNR) detector.

10. The non-transitory computer-readable medium of claim 9, where the one or more instructions to generate the combined unitary transformation operator comprise:
    one or more instructions that, when executed by the processor, cause the processor to:
        determine a unitary transformation operator, and
        generate the combined unitary transformation operator based on the unitary transformation operator and the single-mode unitary operator.

11. The non-transitory computer-readable medium of claim 10, where the one or more instructions to determine the unitary transformation operator comprise:
    one or more instructions that, when executed by the processor, cause the processor to:
        determine the unitary transformation operator for a particular codebook.

12. The non-transitory computer-readable medium of claim 9, where the photonic circuit corresponds to three or more other devices.

13. The non-transitory computer-readable medium of claim 12,
    where the three or more other devices include the combined unitary transformation device and two or more PNR detectors, and
    where the two or more PNR detectors include the PNR detector.

14. The non-transitory computer-readable medium of claim 9, where the instructions further comprise:
one or more instructions that, when executed by the processor, cause the processor to:
represent, before generating the combined unitary transformation operator, the optical receiver as a combination of the single-mode unitary operator and the PNR detector.

15. The non-transitory computer-readable medium of claim 9, where the one or more instructions to generate the single-mode unitary operator comprise:
one or more instructions that, when executed by the processor, cause the processor to:
generate the single-mode unitary operator based on a format of a unitary transformation operator.

16. A system for generating a combined unitary transformation device comprising:
a device, including a memory and a processor, to:
generate a single-mode unitary operator for a receiver;
generate a combined unitary transformation operator based on the single-mode unitary operator; and
generate, based on the combined unitary transformation operator, a layout of a photonic circuit, for implementing a joint-detection receiver, that corresponds to a plurality of devices, the plurality of devices including the combined unitary transformation device and a photo number resolving (PNR) detector.

17. The system of claim 16, where the plurality of devices further include two or more other PNR detectors.

18. The system of claim 16, where, when generating the combined unitary transformation operator, the device is to:
generate the combined unitary transformation operator based on a unitary transformation operator and the single-mode unitary operator.

19. The system of claim 16, where, when generating the combined unitary transformation operator, the device is to:
determine a matrix that corresponds to a unitary transformation operator, and
generate the combined unitary transformation operator based on the matrix and the single-mode unitary operator.

20. The system of claim 19, where, when generating the combined unitary transformation operator, the device is to:
generate another matrix that corresponds to single-mode unitary operators, and
generate, based on the matrix and the other matrix, a combined transformation matrix that corresponds to the combined unitary transformation operator.

* * * * *